United States Patent [19]

Dozier

[11] 4,348,743

[45] Sep. 7, 1982

[54] SINGLE CHIP MOS/LSI MICROCOMPUTER WITH BINARY TIMER

[75] Inventor: Harold W. Dozier, Carrollton, Tex.

[73] Assignee: Mostek Corporation, Carrollton, Tex.

[21] Appl. No.: 234,174

[22] Filed: Feb. 13, 1981

Related U.S. Application Data

[63] Continuation of Ser. No. 136,587, Apr. 2, 1980, abandoned, which is a continuation of Ser. No. 2,425, Jan. 10, 1979, abandoned, which is a continuation of Ser. No. 815,932, Jul. 15, 1977, abandoned, which is a continuation-in-part of Ser. No. 726,579, Sep. 27, 1976, Pat. No. 4,142,176.

[51] Int. Cl.³ .................. G06F 7/38; G06F 1/00
[52] U.S. Cl. .................. 364/900; 235/92 T; 364/486; 364/569; 364/701; 368/107
[58] Field of Search ... 364/200 MS File, 900 MS File, 364/484, 486, 569, 701, 705, 715; 307/293; 328/129; 368/89, 107, 108, 113; 235/92 CC, 92 CP, 92 DP, 92 FQ, 92 PE, 92 T, 92 TF

[56] References Cited

U.S. PATENT DOCUMENTS

| | | | |
|---|---|---|---|
| 3,757,306 | 9/1973 | Boone | 364/200 |
| 3,793,631 | 2/1974 | Silverstein | 364/200 |
| 3,824,378 | 7/1974 | Johnson | 235/92 PE |
| 3,833,888 | 9/1974 | Stafford | 364/200 |
| 3,909,791 | 9/1975 | Wouter van den Berg | 364/900 |
| 3,930,142 | 12/1975 | Meier | 235/92 T |
| 3,937,932 | 2/1976 | Ahlgren | 235/92 PE |
| 3,969,724 | 7/1976 | Anderson | 364/200 |
| 3,984,813 | 10/1976 | Chung | 364/200 |
| 4,001,788 | 1/1977 | Patterson | 364/200 |
| 4,003,028 | 1/1977 | Bennett | 364/200 |
| 4,004,281 | 1/1977 | Bennett | 364/200 |
| 4,063,308 | 12/1977 | Collins | 364/200 |
| 4,144,447 | 3/1979 | Fussum | 235/92 T |
| 4,144,561 | 3/1979 | Tu | 364/200 |
| 4,159,516 | 6/1979 | Henrion | 364/200 |

*Primary Examiner*—James D. Thomas

[57] ABSTRACT

A microcomputer which is implemented by MOS/LSI techniques on a single semiconductor chip is disclosed. The computer includes a data processing system having control logic means, means for exchanging data with peripheral devices through at least one data transfer port, an ALU, and program storage means in which a set of microprograms are stored including at least a first microprogram for controlling the execution of instructions issued from the control logic means. A binary timer is provided which permits operation in an interval timer mode, a pulse width measurement mode, and an event counter mode. The binary timer cooperates with an interrupt logic unit to process an interrupt request in response to time-out signals from the binary timer, and also in response to an external interrupt request. In a preferred embodiment, a derivative of the external interrupt request is synchronized with a machine clock cycle to permit interrupt request decoding operations to be performed during the same machine cycle that the interrupt request occurs thereby increasing the maximum bit rate at which serial information may be sampled through the external interrupt request input.

10 Claims, 5 Drawing Figures

SINGLE CHIP MOS/LSI MICROCOMPUTER WITH BINARY TIMER

CROSS-REFERENCE TO RELATED APPLICATION

This is a continuation of application Ser. No. 136,587, now abandoned, filed Apr. 2, 1980, which is a continuation of application Ser. No. 2,425, now abandoned, filed Jan. 10, 1979, which is a continuation of application Ser. No. 815,932, now abandoned, which is a continuation-in-part of application Ser. No. 726,579 filed Sept. 27, 1976, now U.S. Pat. No. 4,142,176 issued on Feb. 27, 1979, filed July 15, 1977.

BACKGROUND OF THE INVENTION

1. Field of the Invention:

This invention relates generally to digital data processing systems, and in particular, to the architecture of a MOS/LSI microprogrammed computer which is fabricated on a single semiconductor chip.

2. Description of the Prior Art:

An important improvement in computer control implementation is the replacement of conventional transistor logic with "stored logic" or microprogrammed control, stored in a high speed, nondestructive read-only memory (ROM). Microprogramming has made it possible to have the same comprehensive "industry standard" instruction set (operation codes) built into a line of new computers which are architecturally compatible but which may have different internal hardware, organization, and structure. Additional advantages which the microprogramming approach offers is the minimum geometry for circuit logic functions which may be implemented by MOS/LSI circuit techniques.

A general understanding of a digital computer is necessary to understand the objects of the invention. Any data processing system, including a digital computer, can be organized into five distinct functional sections: input, storage, arithmetic and logic unit (ALU), output, and control. These functional sections communicate with each other by means of electronic signals which represent data, instructions, and control signals. The order, timing, and direction in which this information flows within and between the functional sections are effected by the control section. The control section directs the operations of the entire computer. It receives units of information from the storage section which tell it which operations are to be performed and where the data to be operated on are located in the storage section. After the control section determines the exact construction to be executed, it then issues control signals to open and close the specific gates throughout the system, thus permitting the necessary data in the form of electrical signals to flow from one functional unit to another in the execution of that operation. Once the arithmetic and logic section has performed its function, the control section may issue the necessary control instruction to permit the results to be transmitted back into the storage section or to be channeled into some output device to be stored on another storage media. At the end of the execution of an instruction, the control section causes the computer to proceed to fetch and decode the next instruction.

Implementation of microprogrammed control for digital computers has made possible the control of microspect functions (adder, shifter, and other hardware facilities) by means of minimum geometry, extremely low load MOS/LSI logic function elements. It is a general object of the present invention to provide a microprogrammed computer system having improved performance and higher packing density. In particular, it is an object of the invention to provide such a microprogrammed computer which may be implemented by MOS/LSI techniques on a single semiconductor chip.

SUMMARY OF THE INVENTION

The microprogrammed computer of the present invention is implemented on a single semiconductor chip by MOS/LSI techniques. The computer includes a data processing system having control logic means, means for exchanging data with peripheral devices through at least one data transfer port, program storage means in which a set of microprograms are stored including a microprogram for controlling the execution of instructions issued from the control logic means, and an arithmetic and logic unit for performing operations on data words under program control. A binary timer is provided which permits operation of the system in an interval timer mode, a pulse width measurement mode, and an event counter mode. The binary timer cooperates with an interrupt logic unit to process an interrupt request in response to time-out signals from the binary timer, and also in reponse to an external interrupt request. In a preferred embodiment, a derivative of the external interrupt request is synchronized with a system clock cycle to permit interrupt request decoding operations to be performed by the main control logic during the same clock cycle that the interrupt request occurs thereby increasing the maximum bit rate at which serial information may be sampled through the external interrupt request input.

The novel features which characterize the invention with respect to its organization and method of operation, together with further objects and advantages, will be better understood from the following description of a preferred embodiment when considered in connection with the accompanying drawing.

DESCRIPTION OF A PREFERRED EMBODIMENT

Figure 1:
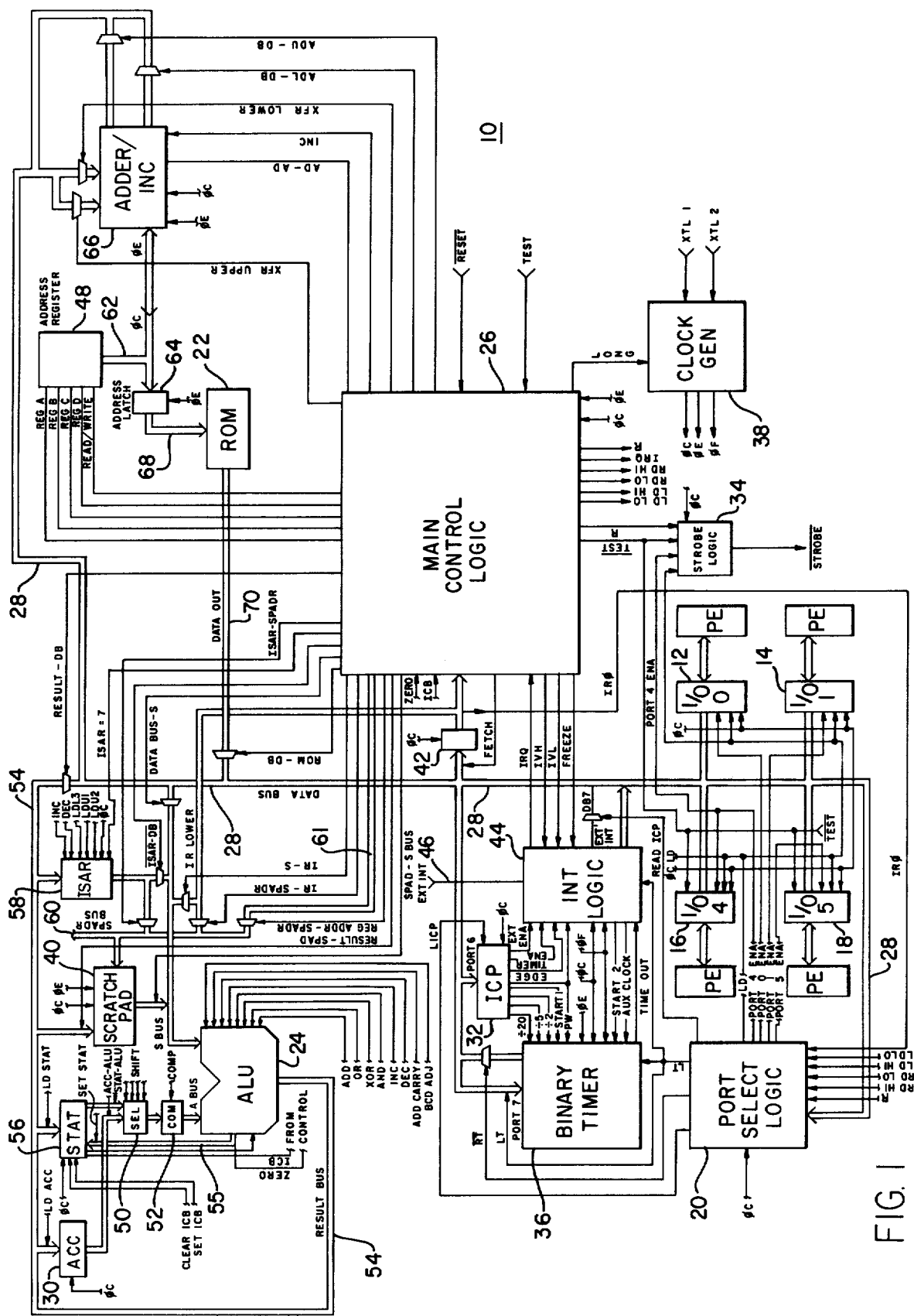
FIG. 1 is a block diagram of a microprogrammed computer having functional elements which are interconnected according to the teachings of the present invention.

Referring to FIG. 1, there is shown a microprogrammed computer 10 which may be implemented by MOS/LSI techniques and which may be fabricated on a single semiconductor chip. The principal functional sections of the microcomputer 10 are the input-output ports 12, 14, 16, and 18 and the port select logic 20, the program and data storage read-only memory (ROM) 22, the arithmetic and logic unit (ALU) 24, and the main control logic 26. These principal functional sections communicate with each other through signals that represent data, instructions, and control signals during the execution of a data processing program. The order, timing, and direction in which this information flows within the computer 10 are effected by the main control logic 26. The main control logic 26 is in turn directed by the sequence of machine instructions or program instructions which are stored in the ROM 22. In the discussion which follows, the principal and auxiliary elements of the microcomputer 10 will be described in detail.

INPUT/OUTPUT PORTS

Each of the I/O ports 12, 14, 16, and 18 are identical, with the only difference being the address assigned to each port by the main control logic 26. In the discussion which follows, these ports will be referred to as ports 0, 1, 4 and 5, respectively, according to conventional instruction set nomenclature. A description of I/O port 4 will be representative of each of the ports.

I/O port 4 is an eight bit latch which includes logic circuitry which on command from the load signal LD in combination with the signal ENA 4 instructs the I/O port 4 to perform a load of the information coming in on the main data bus 28. The loading procedure is synchronized with the clock signal $\Phi C$ so that the data on the data bus 28 will be stabilized. The data from the data bus is presented to the I/O port 4 in the form of an eight bit binary word. The word could be a binary coded decimal word or it could be a binary code that represents a character to peripheral equipment (PE) such as a printer. The data from the data bus originates from an accumulator 30 which is a part of the data processing subsystem of the computer. In every case of a data output to I/O port 4, the main control logic 26 controls the various gates so that the information stored in the accumulator 30 is guided through the data bus to the I/O port 4. Port 4 then takes that information from the data bus and latches it synchronously with the $\Phi C$ clock.

Another task which can be performed by the logic block I/O port 4 is to read the voltage level on its input pins. This is accomplished when the enable signal, port 4 ENA, goes active and the load signal LD stays inactive. The information on its input pins from the peripheral equipment are driven onto the main data bus 28 and is conducted through various gates to its ultimate destination, the accumulator 30.

I/O port 4 has one additional function which it performs in the test mode. When the input signal $\overline{TEST}$ is activated, that is when the voltage level corresponding to this signal drops to a low level which corresponds to a logic "1", instead of selectively taking the information from the data bus 28, the I/O port 4 logic block will take the data from the data bus and supply it directly to its output pins at all times. This operation is not synchronized with the $\Phi C$ clock. It provides a direct path around the internal latch circuitry. It disables the internal latch circuitry from driving the port pins and instead logically connects the pins directly to the internal data bus 28.

Port 5 has an additional function in the test mode in that when the signal input $\overline{TEST}$ to port 5 drops to a low voltage which corresponds to a logic "1", port 5 will take the information existing on its pins and drive it into the internal data bus 28. This permits port 5 to be a dedicated input to the internal data bus during the test mode and port 4 to be a dedicated output from the internal data bus whereby an external tester may be utilized to input test signals on the internal data bus through port 5 and monitor the internal data bus through port 4 to validate the test.

The input/output ports 0, 1, 4 and 5 are complete bi-directional input/output ports. In addition, an interrupt control port 32 which will be discussed hereinafter is addressed as port 6. A binary timer 36, also discussed hereinafter, is addressed as port 7. An output instruction (OUT or OUTS) causes the contents of the accumulator 30 to be latched into the port which has been addressed. An input instruction (IN or INS) transfers the contents of the port to the accumulator 30.

STROBE LOGIC

A strobe logic unit 34 is associated with the operation of I/O port 4. The strobe logic unit 34 supplies a single pulse output signal $\overline{STROBE}$ after I/O port 4 has been loaded with new data. The strobe logic unit 34 in its basic mode is responsive to the combination of the signal PORT 4 ENA being active and the load signal LD being active, which indicates that new data is being loaded from the data bus 28 into the latch circuitry of I/O port 4. The strobe logic then delays that information for one $\Phi C$ cycle whereupon it then produces a single, negative going pulse which remains low for two $\Phi C$ cycles and then rises. This flag may be used to signal a peripheral device (PE) that the computer 10 has just completed an output of new data to port 4. The delay ensures that the new data is latched and stabilized into the port 4 latch circuitry before the strobe signal is conducted to the peripheral device.

A second function of the strobe logic unit 34 is to provide a synchronizing clock to an external tester during the test mode to indicate what machine cycle the computer is in. This information is presented as the inverse of the clock cycle $\Phi C$. When the signal $\overline{TEST}$ to the strobe logic becomes active, the strobe output simply becomes the inverse of $\Phi C$. Its output is $\Phi C$ inverted so that a tester is informed as to when a machine cycle starts and ends within the computer 10 so that it can coordinate the forcing of information onto the data bus 28 and the strobing of information from the data bus via port 5 and port 4.

Another input to the strobe logic unit 34 is the signal R from the main control logic 26 which is utilized to inhibit the strobe output. The signal R is active during the reset state of the machine which permits the execution of test routines to be synchronized with the $\Phi C$ clock. For example, in a test mode the strobe output will be active and an external tester may attempt to force data onto port 5 and read data from port 4. However, the computer 10 is still in a reset state, and even though there is sufficient voltage for the clock generator circuitry to work, there is no guarantee that there is sufficient voltage for the rest of the circuitry to operate and therefore the computer 10 may be held in the reset state by internal power on clear logic which is located in the main control logic 26. Therefore, while the computer 10 is in the reset state, the main control logic prohibits the strobe output from becoming active. As soon as the computer 10 starts to execute its first instruction, that is, as soon as it is reset, the strobe output will start to produce $\Phi C$ inverse pulses which permits the tester to synchronously force instructions into port 5 and receive valid data from port 4.

CLOCK GENERATOR

Figure 2:
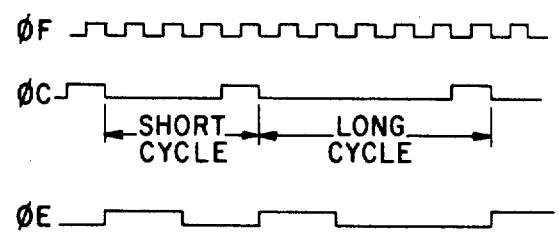
FIG. 2 illustrates timing signals which are used to obtain synchronous data transfers between various logic elements of the system.

The timing signals which are required for establishing appropriate cycles of operation are provided by a clock generator 38. For the purpose of the present invention, the clock circuits can be considered conventional in design and may comprise a crystal controlled oscillator and counter circuit. In a preferred embodiment, there are four external modes and one internal mode. In the external modes the clock generator 38 is a logic unit which takes an external timing reference in and produces three system clocks, the ΦF (fast clock), ΦC (main cycle clock), and ΦE (early cycle clock), as shown in FIG. 2 of the drawing. If an external quartz crystal is connected between the XTL 1 and XTL 2 inputs to the clock generator, the clock generator will then produce a ΦF fast clock which is one-half the frequency of oscillation of that crystal. The timing reference may be applied by an external inductor capacitor network or an external resistor capacitor network. In another mode of operation, the timing reference could be provided by an external timing source in the form of a square wave or of a sign wave or some other pulsating signal. The clock generator 38 includes an internal oscillator which is activated when both the XTL 1 and XTL 2 pins are grounded.

The ΦC signal is the cycle clock for the computer system 10. It defines a complete machine cycle. All gating of information onto buses and receiving of information from buses occurs during a single ΦC cycle. The length of the ΦC cycle can be either four or six periods of the ΦF clock cycle. The reason for having a short cycle and long cycle ΦC clock signal is that more time is required for certain complex data transfers in which data travels several internal buses to go from its point of origin to its point of destination in which an inherent propagation delay occurs. For these operations, the main control logic unit 26 will instruct the clock generator that the clock cycle should be extended from four ΦF periods to six ΦF periods. This is implemented by the signal LONG coming into the clock generator circuitry from the main control logic 26.

The ΦE clock signal is an auxiliary clock which has the same period as the ΦC clock. The difference in the two is that the ΦC clock produces a single positive going pulse for the last ΦF period of the machine cycle. That is, in the case of a short cycle, the ΦC clock goes to a logic "0" level at the start of the cycle and remains at that level for three ΦF cycles, then goes to a logic "1" level for one ΦF cycle and then returns to logic "0" level. During a long cycle, the ΦC clock remains at a level corresponding to a logic "0" for five ΦF periods, and then goes to a voltage level which corresponds to a logic "1" for a single ΦF period, and then returns to "0". The fall of the ΦC clock from the logic "1" level to the logic "0" level is defined as the end of the present cycle and the start of the next cycle. The ΦE clock would therefore go from a low level to a high level at the start of the machine cycle. It remains high for the first two ΦF periods of the cycle, and then goes low for the remainder of the cycle.

An example of the use of the ΦF clock is in transferring information into and out of a scratch pad register 40 as will be discussed hereinafter. Information is transferred out of the scratch pad register 40 during the early part of the cycle when the ΦE clock is at a positive level. Once the ΦE clock goes to a low level, the information coming out of the scratch pad is latched and cannot change, therefore enabling new information during that same cycle to go into the scratch pad and alter the actual register without changing the output of the scratch pad 40. The use of the ΦE clock is for axuiliary purposes and basically provides a single pulse at the early part of the cycle whereas the ΦC clock provides a single pulse at the end of the cycle, without overlap.

PORT SELECT LOGIC

The basic function of the port select logic unit 20 is to select the logical port element which is to be either read from or written to. The main control logic unit 26 will dictate which particular port will be addressed according to the instruction currently being executed. During the operation of the output instruction, the port number is placed on the internal data bus 28, that is, the contents of the internal data bus will be forced to the number 04, indicating that port 4 is being addressed. The port select logic unit 20 scans the internal data bus 28 and retains that information for one cycle. If either the read high (RD HI) or load high (LD HI) signal is active, and if a port address was on the data bus during the preceding cycle, it will therefore address that port whose number was on the data bus during the preceding cycle. At the time the particular port is accessed, if the port is to read out data, the main control logic 26 will activate the read high signal RD HI. The presence of an active load high (LD HI) signal during the cycle following one in which a port address was on the data bus indicates that the port which has been addressed during the previous cycle is to receive information that is currently on the internal data bus 28 and latch that information into its latch circuitry.

With respect to port 7, the binary timer 36, if it is to perform a read operation, the $\overline{RT}$ signal will be activated, and if it is to perform a load operation, the signal LT will be activated. Also, the load ICP and read ICP signals on the interrupt control port 32 will be activated.

The method by which ports 0 or 1 is addressed is slightly different than the method for ports 4 and 5. When port 0 or 1 is addressed, the address is not driven onto the data bus in the prior cycle. Instead, if port 0 or port 1 is to be activated, then either the read low signal RD LO or the load low signal LD LO will become active during that cycle. The port select logic then determines the state of the IR 0 signal which corresponds to the least significant bit of an instruction register 42. If that signal is in the logic "0" state, that is the indication that it is to access port 0. If that signal is in the logic "1" stage, that is the indication that it is to access port 1. Therefore it accesses port 1 by means of the signal port 1 ENA and the load signal LD in the same manner as port 4 and 5, but unlike port 4 and 5, the selection of either port 0 or 1 depends upon the combination of the signal RD LO or LD LO and the proper state of the IR0 signal.

The signal R input to the port select logic 20 is the inhibit signal from the main control logic 26 which indicates that the computer 10 is in a reset state. When in a reset state, the computer 10 loads during the presence of the inhibit signal, but since there is no driving element on the internal data bus 23, the contents of the internal data bus will be 00, therefore the input/output ports are initialized to a known 00 state. An exception in this embodiment is that ports 0 and 1 are not initialized during reset and maintain the previous contents of the port.

INTERRUPT CONTROL PORT

The interrupt control port unit 32 has been designated as port 6 within the computer system. ICP or interrupt control port 32 is an eight bit write-only latch. When the signal LOAD ICP is active, the data present on the main data bus 28 input to the interrupt control port 32 is latched into the interrupt control port latch circuitry and is synchronized with the ΦC clock signal and is therefore presented to all of the latch outputs during the first ΦC clock cycle following the LOAD ICP signal. When the instruction is executed to read the interrupt control port 32, instead of enabling the information that is stored in the latch circuitry of the interrupt control port into the main data bus at the proper time, the voltage level on the external interrupt pin 46 is enabled onto the data bus bit 7. Nothing is enabled on the remaining data bus pins, therefore they will assume the logic "0" state. Therefore, when the instruction input from port 6 is executed, instead of actually reading the information in the interrupt control port latch, the logic level or the voltage level on the external interrupt pin is transferred to the data bus bit 7 (DB 7).

INTERRUPT LOGIC

In a microprogrammed computer system, an interrupt signal is a request or a command to the main control logic to cease executing the instruction sequence that is presently executing and instead execute another instruction sequence. Some are referred to as nonmaskable interrupts which means that the interrupt is a command rather than a request which cannot be refused. A maskable interrupt is not a command but is a request that the main control logic execute a different instruction sequence from the sequence that it is presently executing.

The function of the interrupt logic unit 44 in the computer system 10 is to provide that request to the main control logic in response to an input from the binary timer 36 or from the external interrupt pin 46. If in response to the request the main control logic is willing to execute the request, it will signal the interrupt logic unit 44 by means of three signals, a FREEZE signal, a pass interrupt vector low or IVL signal, and a pass interrupt vector high or IVH signal. In response to these signals, the interrupt logic unit 44 passes the appropriate address onto the data bus 28.

The active state of the external interrupt signal is defined by the EDGE input to the interrupt logic unit 44. In order to produce an external interrupt signal in normal interrupt operation, it is necessary that the logical state of the signal on the EXT INT pin 46 make an active transition from logic 0 to logic 1. This transition is gated by the external enable signal EXT ENA which operates as an allow function on the external interrupt request. In order to produce a normal external interrupt request of the main control logic, the interrupt logic unit must first have the EDGE bit properly defined, either at a logic "0" or "1", and the external interrupt enabled signal at a logic "1". If an inactive to active transition of the signal on the external interrupt pin occurs, it will then pass an interrupt request to the main control logic by means of the interrupt request $\overline{IRQ}$ signal by pulling that signal to the low voltage or the active state.

The interrupt logic unit 44 will also pass an interrupt request to the main control logic 26 in response to the binary timer signal TIME OUT. When the TIME OUT signal is activated, the interrupt logic unit 44 is informed that the binary timer 36 has performed its proper function and it may then conditionally pass an interrupt request to the main control logic 26. The interrupt logic unit 44 will pass the interrupt request to the main control logic unit at such a time as the timer enable bit is activated. If the timer enable input is in the inactive state at the time the TIME OUT signal produces its pulse, the information that a TIME OUT has occurred is retained until the timer enable input is activated.

However, if the external enable input to the interrupt logic 44 is inactive at the time a proper transition of the external interrupt input occurs that would have normally produced an interrupt request, then the interrupt logic ignores external interrupt requests. When the timer produces the TIME OUT pulse, the external interrupt logic latches that pulse and if the timer enable input to the interrupt logic is active, it will pass the interrupt request to the main control logic.

According to another condition, if the LT signal becomes active, it will clear any stored information related to a residual TIME OUT pulse in the interrupt control logic 44. For example, if a TIME OUT pulse occurs and if the timer enable input to the interrupt logic is in an inactive state, the information that a TIME OUT pulse has occured is latched into the interrupt logic. However, if the LT signal then becomes active, the latch of the TIME OUT signal in the interrupt logic unit 44 is cleared. If the timer enable signal TIMER ENA to the interrupt logic unit subsequently becomes active, no request will be passed to the main control logic because that request was cleared by activating the LT signal.

Another output of the interrupt logic, other than the interrupt request output $\overline{IRQ}$, is a derivative of the external interrupt signal called EXT INT'. The signal EXT INT' represents a logic state of the external interrupt input 46. This signal, which is properly buffered, is used when the input from port 6 or read ICP instruction is executed to drive data bus 7 rather than having the external interrupt pin itself directly drive data bus 7.

Because the interrupt request is a maskable interrupt, the main control logic unit 26 may choose to ignore or accept the interrupt through separate enable and disable circuitry. If the main control logic unit 26 is in the proper state to accept an interrupt request, it responds to the interrupt logic by means of three control signals. The first control signal is the FREEZE output which is activated for one cycle to prevent the interrupt logic from changing its present condition. Following the freeze cycle, the main control logic performs a single ΦC cycle delay. During this delay cycle essentially no computer operation occurs. This delay allows the interrupt logic to fully stabilize. During the next two cycles the main control logic 26 requests that the interrupt logic 44 load the address of the next program instruction on the data bus 28. In response to an interrupt request the main control logic 26 interrogates the interrupt logic by means of the interrupt vector signals to determine the address of the next sequence of instructions. This is called a vector interrupt in that the interrupt logic responds directly with the address of the next instruction sequence. For example, in response to an external interrupt request, the interrupt logic 44 might provide the location 00A0 for the beginning of the new sequence of instructions. If it is in response to the TIME OUT signal from the interrupt logic, the interrupt logic may provide for example the address 0020 to the main control logic and will therefore direct that information into the proper address register so that the next instruction executed comes from that location.

In the present embodiment, an eleven bit address is required to access all of the bites in the read-only memory (ROM) 22. However, the data bus 28 has a capacity of only eight bits. Because the information is passed on the internal data bus 28, it is passed first in a group of eight bits and then the remaining three bits are passed. Therefore, when the main control logic requests that the interrupt logic pass interrupt vector, it must first request the lower portion of the vector followed by the higher portion of the vector. The decision to pass the lower portion of the vector followed by the higher portion of the vector is arbitrary for this example.

For purposes of illustration, assume that the external interrupt pin 46 is properly activated and that a request has been made by the interrupt logic 44 for an interrupt to the main control logic 26. Subsequent to that time but before the main control logic 26 is willing to accept the request assume that the binary timer 36 produces a TIME OUT pulse. The interrupt logic 44 would sustain the request to the main control logic 26 but there are now two requests pending. One request originates from the external interrupt pin 46 and the other request originates from the binary timer 36. In this example, the binary timer 36 input is given priority over the external interrupt input. That is, should a timer interrupt request occur, the timer vector address 0020 will be passed to the data bus 28 and subsequently into an address register so that the next instruction is executed from the location 0020 which is stored in the ROM 22. At a later time when the main control logic 26 has executed the instructions located at location 0020 it will request the vector of the pending external interrupt request and the interrupt logic 44 will pass the vector 00A0 to the data bus 28.

The purpose of the FREEZE signal is to assure that the main control logic 26 will accept only the highest priority interrupt which currently exists in the interrupt logic at that point in time. The FREEZE signal ensures that the complete vector will be passed even if an interrupt request having a higher priority occurs during the transmission of that vector. That is, the interrupt logic 44 is instructed to pass the complete vector regardless of what may happen subsequently on the external interrupt input or on the timer TIME OUT input while the vector is being passed. After the occurrence of the FREEZE signal, in the following ΦC cycle, the interrupt logic is given time to decide which vector to pass. Then in the third ΦC cycle, the main control logic activates the IVL input to the interrupt logic and the interrupt logic accordingly passes the lower eight bits of the interrupt vector onto the data bus 28. In the fourth ΦC cycle, the IVH signal from the main control logic 26 will be activated and in response to that signal, the interrupt logic 44 will pass the upper half of its interrupt vector onto the data bus.

In response to the new address that is passed by means of the vector a FETCH signal is generated from the main control logic unit 26. Two other outputs are generated by the interrupt logic 44 which are defined as START 2 to the binary timer 36 and the auxiliary clock signal AUX CLOCK to the timer. These signals are properly buffered and synchronized to enable and disable the binary timer 36.

ARITHMETIC AND LOGIC UNIT (ALU)

The ALU 24 performs arithmetic and logic operations required to process program instructions. The ALU 24 is a component of the data processing system which includes a shifter selector 50 and a complementor 52. The system is capable of performing arithmetic, shift and logic operations on operands. The ALU 24 is basically a set of logic elements which has two main inputs, the A-bus and the S-bus. These buses are so named because the accumulator 30 is the principal data source for the A-bus, and the scratch pad 40 is the principal data source for the S-bus. There is a main eight bit data output which is designated by the reference numeral 54 and is called the result bus which is basically the logical result of the operation performed on the A-bus and the S-bus inputs.

Another set of outputs in the bus 55 from the ALU 24 which represent the status of the results of the operation that has just been performed in the ALU. The status register 56 is used to store these status signals for use in a subsequent computer operation. The status register 56 holds five status flags as follows: sign, carry, zero, overflow, and interrupt control bit.

The carry signal CRY input to 24 represents the status of the carry flip-flop in the status register 56. This information is presented in the form of a logic "1" or "0" which indicates that there was a carry out of the high order bits as a result of an ALU operation, and that information is latched into the status register 56, and is available to the ALU in subsequent operation cycles. Additionally the complete set of status bits from the status register 56 are available to the ALU via the A-bus. One of the status outputs from the ALU goes directly to the control logic in addition to providing an input to the status register. This is the ZERO signal.

There are several control inputs from the main control logic 26 which the specific operation the ALU is to perform on the various data inputs. One of the control inputs is an ADD which instructs the ALU to do a binary add of the A-bus input and the S-bus input. Another control input to the ALU 24 is called OR which instructs ALU to do the binary OR function on the A-bus and S-bus inputs. There is an exclusive or (XOR) control line, and AND control line for operating on the two input data sets, and there is an increment line INC which instructs ALU to increment the A-bus input only. There is a decrement control line DEC which instructs the ALU 24 to decrement the S-bus. Therefore, when the decrement line DEC is activated, the information on the S-bus is decremented one bit in value and that result is placed on the result bus. There is an ADD CARRY line which instructs the ALU to add the data contents of the A-bus to that on the S-bus and to also add in the carry input.

The remaining control signal is the BCD adjust signal (BCDADJ) which is used for performing binary coded decimal arithmetic. The ALU 24 basically performs binary addition but the results of the binary addition can be adjusted so that the contents represent two decimal digits. For example, if hexidecimal 99 is added to hexidecimal 22, and an ordinary binary add was performed, the result would be BB representing the particular code on the data bus. However, the representation B is not an allowable data decimal digit. It is only an allowable binary or hexidecimal notation for a binary stream. Therefore, the desired result would not be BB but instead would be 21 with a high order carry out of the remainder. Therefore, the ALU 24 will perform a binary add but the results can be adjusted after the binary add is complete so that the quantity is returned from binary format to decimal digit format.

COMPLEMENTOR

Associated with the A-bus input to the ALU 24 is the complementor 52. The complementor 52 inverts the bits of the A-bus before passing it to the ALU. The complementor 52 is activated by the COMP signal input. If the COMP signal is at a logic "0", data passes through the complementor 52 unaltered.

SELECTOR/SHIFTER

Also associated with the A-bus input to the ALU 24 is the combination selector/shifter 50. The selector/shifter 50 can perform six different functions. One data input comes from the accumulator 30 and a second data input comes from the status register 56. The selector 50 can transfer the contents from the accumulator to the ALU unaltered. Similarly, it can transfer the contents of the status register 56 to the ALU unaltered. That would be in response to the ACC - ALU signal and the STAT - ALU signal, respectively. Additionally it can perform other functions on the accumulator input in response to the shift inputs. That is, it will take data existing on the A-bus and shift it right or left by one or more bits in response to a shift right or shift left command from the main control logic unit 26.

ACCUMULATOR

The accumulator 30 is simply an eight bit latch. It has an input from the result bus 54 of the ALU and an output which is coupled into the selector shifter 50. Upon the activation of the control signal LD ACC, the information existing on the result bus will be latched into the accumulator and synchronized with the $\Phi C$ control clock.

STATUS REGISTER

The status register 56 has four inputs from the ALU 24. Those inputs represent the present status of the results of the ALU operation. On command from the set status input signal SET STATUS, the status register receives the information existing on a new status bus 55 which couples the ALU to the status register 56 and latches that information into the status register bits. The fifth status register bit represents the interrupt control bit for the main control logic. This is the bit that is used to instruct the main control logic 26 not to allow an interrupt request from the interrupt logic, even though the external enable or the timer enable bit has allowed the interrupt logic bit 44 to pass an interrupt request to the main control logic. If the interrupt control bit which is maintained in the status register 56 is a 0, the main control logic 26 will ignore the interrupt request and will continue to process the instruction sequence that it is currently processing. However, if the interrupt control bit in the status register is a logic "1", the main control logic 26 is instructed to make the decision as to whether or not to allow the interrupt request as soon as it finishes executing the instruction with which it is currently involved.

The interrupt control bit ICB of the status register 56 is controlled by the main control logic unit 26 by means of a CLEAR ICB signal and a SET ICB signal. When the CLEAR ICB signal is activated and synchronized with the $\Phi C$ clock input, the interrupt control bit will be forced into the logic "0" state. When the SET ICB signal is activated and synchronized with the $\phi C$ clock, the ICB bit is set to a logic "1". The ICB bit of the status register 56 can also be altered by a LOAD STAT signal which would cause the contents of the result bus 54 to load all five bits of the status register 56.

SCRATCH PAD REGISTER

The scratch pad register 40 provides a number of eight bit registers, for example sixty four, which may be used as general purpose RAM memory. This set of registers is used to store variable data during the execution of a program. The scratch pad register 40 can be loaded from the result bus 54, that is from the results of the ALU 24 on command by the RESULT-SPAD control input. When that signal is activated and synchronized with the $\phi C$ clock, the data that exists on the result bus 54 at that point in time will be loaded into the appropriately addressed register.

The scratch pad register array 40 has a single eight bit output which drives onto the S-bus input to the ALU 24. On command from the SPAD to S-bus signal synchronized with the $\phi E$ clock, the scratch pad 40 transfers the data from the address register of the scratch pad onto the S-bus of the ALU 24. Therefore, data is read from the scratch pad 40 which is synchronized with the $\phi E$ clock and is written into the scratch pad synchronized with the $\Phi C$ clock.

Another input into the scratch pad 40 is the six bit register address. This comes from the SPADR bus which permits each register 0-64 to be addressed.

S-BUS

The S-bus is the second fundamental input to the ALU 24. One information input is from the scratch pad 40 in response to the signal SPAD-S from the main control logic 26. A second source of information for the S-bus is the lower four bits of the instruction register 42 and in response to the signal IR-S, the least significant four bits of the instruction register 42 will be transferred to the least significant four bits of the S-bus and the upper four bits of the S-bus will contain 0.

Another possible input to the S-bus comes from the ISAR or the indirect scratch pad address register 58. In response to an active ISAR-DATA BUS signal, the ISAR will transfer the six bits of ISAR onto the lower six bits of the S-bus and the upper two bits will be 0. The ISAR can be visualized as holding two octal digits. This devision of ISAR is significant since a number of instructions increment or decrement only the least significant three bits of ISAR when referencing scratch pad bytes by means of ISAR. This makes it easy to reference a buffer consisting of contiguous scratch pad bytes.

Another possible source of information on the S-bus comes from the main data bus 28. In response to the control signal DATA BUS-S, the eight bits of the data bus 28 will be transferred to the eight bit S-bus.

If none of the above possible elements are driven onto the S-bus, the contents of the S-bus will be 0. To understand the significance of this condition, consider the situation where it is desired to transfer the contents of the accumulator 30 onto the main data bus without altering the information. To carry out this procedure, the ACC-ALU input to the shifter 50 is activated. That will transfer the information from the accumulator 30 through the shifter 50 with its output unaltered to the complementor 52. The complement control to the complementor 50 is inactive, therefore the information will pass directly through the complementor without being altered, and the contents of the A-bus are essentially the contents of the accumulator 30 because no shifting or complementing has taken place. The ADD signal to the ALU 24 will be active. This will cause the result bus to contain the binary summation of the contents of the A-bus input and the S-bus input. If, however, no driver element is selected to drive the S-bus, the contents of the S-bus will be zero. Adding zero to the contents of the A-bus will produce a result which is equal to the contents of the A-bus. Thus the information on the A-bus which originated from the ACC in effect passes through the ALU unaltered on to the result bus 54. From the result bus the data may be transferred to the data bus 28.

SCRATCH PAD ADDRESS BUS

The source of the address for the scratch pad register array 40 is the scratch pad address bus 60. The scratch pad address bus 60 is a six bit bus which allows all 64 scratch pad registers to be accessed. The six bits of ISAR can be driven onto the scratch pad address bus in response to the control signal ISAR-SPADR. Another source of information for the scratch pad address bus 60 is the least significant four bits of the instruction register 42. In response to the signal IR-SPADR, the least significant four bits of the instruction register are transferred to the least significant four bits of the SPADR bus and the upper two bits of the SPADR bus will be 0's. A final possible source of information is a four bit register address bus 61 generated by the main control logic 26. In response to a control signal, REG ADDR-SPADR, which corresponds to register address to scratch pad address bus, a four bit register address is generated directly by the main control logic 26 and is transferred through the bus 61 onto the scratch pad address bus 60. This permits the main control logic 60 to directly access the 16 lowest registers of the scratch pad register array in response to certain instructions.

ISAR LOGIC

The ISAR logic unit 58 is the indirect scratch pad address register. In this embodiment it is a six bit register which can be used to supply the address of a scratch pad register in the scratch pad array 40. The input to the ISAR comes from the result bus 54 which is the result of the ALU operation, and there are several control inputs from the main control logic 26. In response to the LOAD UPPER 1 signal from the main control logic, the fourth, fifth and sixth most significant bits from the result bus 54 will be loaded into the upper three bits of the ISAR 58. In response to the LOAD UPPER 2 signal from the main control logic, the lower three bits of the result bus will be loaded into the upper three bits of the ISAR. In response to the LOAD LOWER 3 signal from the main control logic, the lower three bits of the result bus will be loaded into the lower three bits of the ISAR.

Therefore, the ISAR may be loaded by three different methods. All six bits of the ISAR may be loaded at one time, by transferring the lower three bits from the result bus 54 into the lower three bits of ISAR and the fourth, fifth and sixth most significant bits of the result bus into the three upper bits of the ISAR. In order to perform this operation, both the LOAD LOWER 3 signal and the LOAD UPPER 1 signal would be activated at the same time. Additionally, either half of the ISAR may be loaded. The upper three bits of the ISAR may be allowed to remain the same while the lower three bits may be loaded with a new piece of information. In this case, the information would be communicated in response to the result bus and in response to the LOAD LOWER 3 signal, only the lower three bits of the ISAR would be loaded from the lower three bits of the result bus 54. If it is desired to leave the lower three bits of the ISAR unchanged and alter the upper three bits of the ISAR, this can be accomplished by loading the new information for the upper three bits of ISAR onto the result bus 54 and activating only the LOAD UPPER 2 signal.

Any transfer of information from the result bus 54 into the ISAR 58 is synchronized with the $\phi C$ clock. In addition, the contents of the lower three bits of the ISAR may be either incremented or decremented or remain unaltered. Therefore in response to the increment signal INC, the contents of the lower three bits of the ISAR are supplied to the ISAR output and upon synchronization with the $\phi C$ clock, at the start of the next machine cycle, the new contents of the lower three bits of the ISAR would be one greater than it was in the previous cycle. In response to the decrement signal DEC, the contents of the ISAR that currently exist are driven onto its output bus but at the end of the cycle, and the information loaded back into the ISAR would be the same except that the lower three bits are decremented. This permits the eight bit sections of the scratch pad 40 to be easily accessed without reloading the ISAR.

INSTRUCTION REGISTER

The instruction register 42 receives the instruction to be executed from the program ROM 22 by means of the data bus 28. During all operation code fetches eight bits are latched into the instruction register 42. Some instructions are completely specified by the upper four bits of the OP code. In those instructions the lower four bits are an immediate register address or an immediate four bit operand. Once latched into the instruction register 42 the main control logic 26 decodes the instruction and provides the necessary control gating signals to all circuit elements. The instruction register 42 takes information off of the main data bus 28 and in response to the control signal FETCH, and synchronized with the $\Phi C$ clock it pitches that information from its input into its internal latches and presents that information on its output. The output of the instruction register is the eight bits of its latches which are conducted into the main control logic 26. In addition, the four least significant bits also are communicated to the S-bus and scratch pad address bus through appropriate gating circuitry. The least significant bit, IR0 is one of the outputs provided by the instruction register 42 for the port select logic 20 as discussed above.

ROM ADDRESS REGISTER

There are four registers associated with the ROM address register array 48. These are the program counter (PC), the stack register (P), the data counter (DC) and the auxiliary data counter (DC1). The program counter is used to address instructions or immediate operands. The stack register is used to save the contents of the program counter during an interrupt or subroutine call. The data counter is used to address data tables. There is a control input from the main control logic unit 26 for each of these registers in addition to a READ/WRITE input. The register inputs are used to access the appropriate register within the address register array 48 while the READ/WRITE input is used to dictate whether that register is enabled onto the address register output lines or whether the information on the address register lines is written into that register. Therefore the lines coming out of the address register array are bidirectional and depend upon the state of the READ/WRITE signal to determine whether the information on those lines will either be supplied from the address register or will be written into the properly addressed register.

In response to a proper register being addressed and the READ line being activated, the register contents will drive onto the address register output bus 62. This is a bidirectional bus, and if the READ/WRITE line is in the read state, the information will drive onto the bus 62. At that point in time, it will be transferred into a latch 64 and into an adder/incrementer 66. During the time the $\Phi E$ clock is active, the information existing on the input bits of the address latch 64 and will be transferred through latch to its output bits. When the $\Phi E$ clock is inactive, the information on the input to the latch 64 may change but the output of the latch will remain the same. Therefore, early in the cycle an appropriate register is addressed, the READ line is placed in the read state, and the information is driven from the register 48 onto the ROM address bus 68. When the $\Phi E$ clock goes inactive, the information on the address register bus 62 could change but the ROM address bus information would not change because it is held stable by the address latch 64.

ADDER/INCREMENTER

Associated with the ROM address register array 48 is an adder/incrementer 66. This logic element increments the register PO or the register DC when required and is also used to add displacements to the register PO on relative branches or to add the data bus contents to the register DC in the add data counter (ADC) instruction.

The adder/incrementer logic block 66 performs the basic function of maintaining the proper address in the address registers 48 as controlled by the main control logic 26. During the execution of a set of instructions, unless an instruction branch or jump is encountered, the program counter will proceed serially through the particular set of instructions that it is executing. In this mode of operation, the adder/incrementer 66 and the address latch 64 receive the address from the address register array 48 early in the cycle while the $\Phi E$ clock is active and in response to the increment command from the main control logic 26 add one to the address on the address bus 68. When the $\Phi C$ clock becomes active it will then drive the incremented information back onto the ROM address bus and if the main control logic has switched the READ/WRITE line from the READ state to the WRITE state on the ROM address register file, the incremented information will be loaded back into the program counter of the address register 48.

There are several occasions where it is desired to transfer the information in the ROM address register array 48 to a location in the scratch pad 40. For example, when an interrupt is executed the current contents of the program counter is stored or is placed in the stack register P and the program counter is loaded with the vector address supplied by the interrupt logic. The next instruction executed begins at that vector address. In the event a second interrupt were to occur, while the first interrupt routine is being executed, the contents of the program counter would be saved in the stack register P and the new instruction sequence location would be loaded into the register PC0. However, the information that was in the register P previously was the address to which the execution should return once all the interrupts are serviced. In this event if a second interrupt were to occur, the information in the register P (the original contents of the program counter) would be lost. Therefore in certain circumstances it is desirable to save the contents of the register P in protected storage where certain program events cannot easily cause it to be reloaded with another number. Therefore it is desirable that a data path exist to transfer the contents of the address registers into the scratch pad register array 40.

To transfer the contents of an address register to the scratch pad register 40, the main control logic 26 selects a proper register in the address register file, and selects it to be read; therefore the selected register's contents would drive out on the ROM address bus 68 into the adder/incrementor 66. When the data capacity of the address register is greater than the data capacity of the internal data bus, more than one machine cycle is required to transfer the contents of the address register. In the present example, the address register has an eleven bit capacity and the data bus has an eight bit capacity. Therefore, during one cycle the main control logic 26 may enable the stack register P to drive the ROM address bus 68. The control signal ADL - DATA BUS when activated enables the transfer of the lower eight bits of the adder/incrementor 66 onto the main data bus 28. That information would be conveyed through the main data bus 28 and the main control logic 26 would open the appropriate gates to transfer that information from the main data bus onto the S bus through the ALU 24 and ultimately into the scratch pad register array 40. Then in the next machine cycle the main control logic would again address the stack register P and activate the READ line so that the register P is driven onto the ROM address bus 68 and into the adder/incrementor. The adder/incrementor control line ADU - DB would be activated so the adder/incrementor would then transfer the upper three bits of the eleven bit address onto the lower three bits of the data bus 28. The other gating signals throughout the circuit would be arranged properly to permit that information to travel through the data bus 28 and ultimately into the scratch pad 40.

It is sometimes desirable to load the address registers from the scratch pad register array 40 or from some other source such as the program ROM 22. To carry out these operations information is conveyed from the main data bus 28. In order to transfer information from the main data bus into the ROM address register array 48, it must first pass through the adder/incrementor. If the control signal XFR LOWER is activated, this would allow the eight bits of the data bus to be transferred through the adder/incrementor 66 onto the lower eight bits of the ROM address bus. After the proper register of the address register 48 was addressed, and the correct control line activated, that information would be written into the proper address register.

In order to transfer the information from the data bus 28 into the upper three bits of an address register, the adder/incrementor control signal XFR UPPER would be activated which causes the lower three bits of the data bus to be transferred to the upper three bits of the ROM address bus 68 so that it may be written into the appropriate address register.

The main control logic 26 decides whether the instruction execution is to proceed with the next instruction in sequence or jump forward or backwards. In order to make the program counter skip forward or backward for a program branch, it is necessary to add a positive or negative displacement to the program counter to make its new contents either greater or less than they would otherwise be. The displacement to be added to the program counter will be contained on the data bus 28. The main control logic 26 will instruct the adder/incrementor 66 to transfer the contents of the data bus 28 into the adder/incrementor. It will also by means of the signal ADDRESS-ADDER instruct the adder/incrementor 66 to transfer the ROM address bus 68 contents to the other input of the adder/incrementor. It will then add the two inputs together and upon activation of the ΦC clock will drive the results of the summation back onto the ROM address bus where it may be written back into the program counter of the ROM address register array 48.

READ ONLY MEMORY (ROM)

The ROM 22 is the principal location for program storage. The program storage could alternately be read/write memory or some combination of read-only memory and read/write memory. The ROM is preferably implemented by ion-implanted, N-channel silicon gate technology in a series read-only memory structure as disclosed in the copending application Ser. No. 726,579, filed Sept. 27, 1976 by Harold W. Dozier and assigned to the assignee of the present invention.

The microcomputer program and data constants are stored in the program ROM 22. When a ROM access is required, the appropriate address register (PO or DC) is gated onto the ROM address bus and the ROM output is gated onto the main data bus 28. The first byte in the ROM is location 0.

Upon activation of the RESET input signal or when the power is first applied to the computer 10, the main control logic 26 gates the information from the data bus 28 into the appropriate address registers of the ROM address register array 48. At that point during the reset cycle no driving element is selected on the data bus, therefore the information on the data bus is byte 0. That information is gated into the appropriate address register, particularly the program counter, such that when execution begins the program counter contains a location 00. From there executions of instructions proceed serially unless a program branch or jump is encountered or unless an interrupt occurs which causes the suspension of the execution of that sequence instructions and the execution of a sequence of instructions located at a vector address. The ROM 22 receives the address from the ROM address bus 68 through the address latch 64 and supplies the data from the addressed ROM location into its data output bus 70.

Information is transferred from the ROM 22 onto the main data bus 28 in response to the ROM-DATA BUS signal. If the information being read from the ROM at that point in time is an instruction, that information is conveyed on the internal data bus and the FETCH input to the instruction register 42 would be activated such that the information passes from the ROM 22 through the internal data bus 28 into the instruction register 42. Information other than an instruction such as data is transmitted to other parts of the machine by the gating instructions issued by the main control logic 26.

MAIN CONTROL LOGIC

The main control logic unit 26 functions as the director of information within the computer 10. Within every subsystem of the computer 10 are major buses and major logic elements which can perform certain functions on the data and transmit data from one point to another. The particular function implemented by the microcomputer system 10 is therefore a function of what data is transferred from location to location and at what time particular logical functions are performed upon that data. The main control logic 26 provides the control outputs for all other logic blocks and the gating signals to all the major buses within the machine.

The control inputs to the main control logic 26 consist of the instructions it received from the instruction register 42 for the microprocessing subsystems of the computer 10. For example, if it is desired that the microprocessor increment the contents of the accumulator 30, the instruction INC-ACC is placed at the appropriate place in the program ROM 22. When the instruction is fetched from the program ROM it is placed in the instruction register where it is conveyed to the main control logic and decoded. The main control logic 26 decodes that the instruction is the increment accumulator instruction and therefore proceeds to activate and deactivate the proper control outputs and gates to make all logic blocks within the system respond so that the content of the accumulator 30 is incremented.

The control outputs necessary to produce this result include activating the signal ACC-ALU which first gates the flow of the data from the accumulator 30 through the selector shifter 50. The shift signals of the selector 50 are not activated so that the data passes through the shifter unaltered. The main control logic deactivates the complement signal COMP so that the information passes through the complementor unaltered. All of the gating signals which can gate various logic elements onto the S-bus are deactivated so that the contents of the S-bus become 0. Also, the increment signal on the ALU is activated. Therefore, the contents of the A bus as conveyed into the ALU 24 is incremented and the incremented result appears on the result bus 54. The load accumulator signal LD ACC is activated so that the information from the result bus is placed back into the accumulator 30 synchronously with the ΦC clock. All of the signals controlling I/O ports, ISAR, scratch pad and strobe are deactivated. However, it is necessary that the main control logic 26 also activate some of the signals in the addressing logic so that the next instruction may be fetched.

While the main control logic unit 26 is activating the signals to make certain that the accumulator 30 is incremented, it also must fetch the next instruction. In this case, the program counter register is accessed thereby enabling it to drive onto the ROM address bus. By selecting the appropriate register address line of the address registers, it activates the READ line to the address registers and the contents of the program counter appear on the ROM address bus. The main control logic unit 26 supplies the increment signal INC to the adder/incrementor 66 so that the ROM address bus is incremented. The READ-WRITE signal is switched to the write state so that the information is written back into the program counter. On the next cycle the incremented value is accessed onto the ROM address bus and therefore the next instruction in the program ROM is fetched. After the instruction is placed in the instruction register 42, the main control logic will activate and deactivate its controlling signal such that the instruction is properly executed.

An exception to the fetch procedure described above occurs when an interrupt request is presented to the main control logic 26 by the interrupt logic unit 44. If the proper conditions are satisfied, instead of fetching a new instruction from the ROM and placing it in the instruction register 42 as previously described, the main control logic instead activates the proper control outputs to ensure that the interrupt vector location is passed from the interrupt logic unit 44 into the program counter of the address register 48. On the next instruction FETCH the vector address is the new address which is fetched.

A further exception to this procedure occurs when the $\overline{\text{RESET}}$ signal input to the computer is activated. When this occurs the main control logic 26 will cease execution of instruction that is currently executing and will activate the proper control signal so that it loads the program counter with 00 as previously described. When the reset input is deactivated, the main control logic 26 will begin fetching and executing instructions beginning with the ROM location 00. A condition similar to RESET may be produced when the power is first applied to the system or the power is removed or reduced for a short period of time and then restored to a normal operating level. Internal to the main control logic 26 is a power on clear circuit which senses that the power has either first initially been applied or has been reduced to some nonfunctional voltage level and then subsequently returned to an acceptable voltage level. If any of these circumstances occur, the main control logic will perform a RESET so that the program counter is returned to the location 00 from which location the program execution commences.

The TEST input to the main control logic informs the main control logic that it is currently in the test mode. This TEST input unlike other inputs is a three level input. If the input is at a low voltage state, it is deactivated in the main control logic interprets the instructions and activates or deactivates appropriate control signals to make the processor function normally. If the test input to the main control logic is forced to a very high voltage it will activate the $\overline{\text{TEST}}$ output that goes to the strobe logic and the I/O ports 4 and 5 logic. It will also deactivate the ROM to data bus signal so that the normal mode of operation will be suspended and information from the program ROM will not be allowed to pass to the internal data bus. In this situation it is likely that the data supplied to the internal data bus will be received from port 5 and that instead of fetching an instruction from the internal ROM the instruction will be fetched from a peripheral device through port 5 when it is in the test mode.

BINARY TIMER

Figure 3:
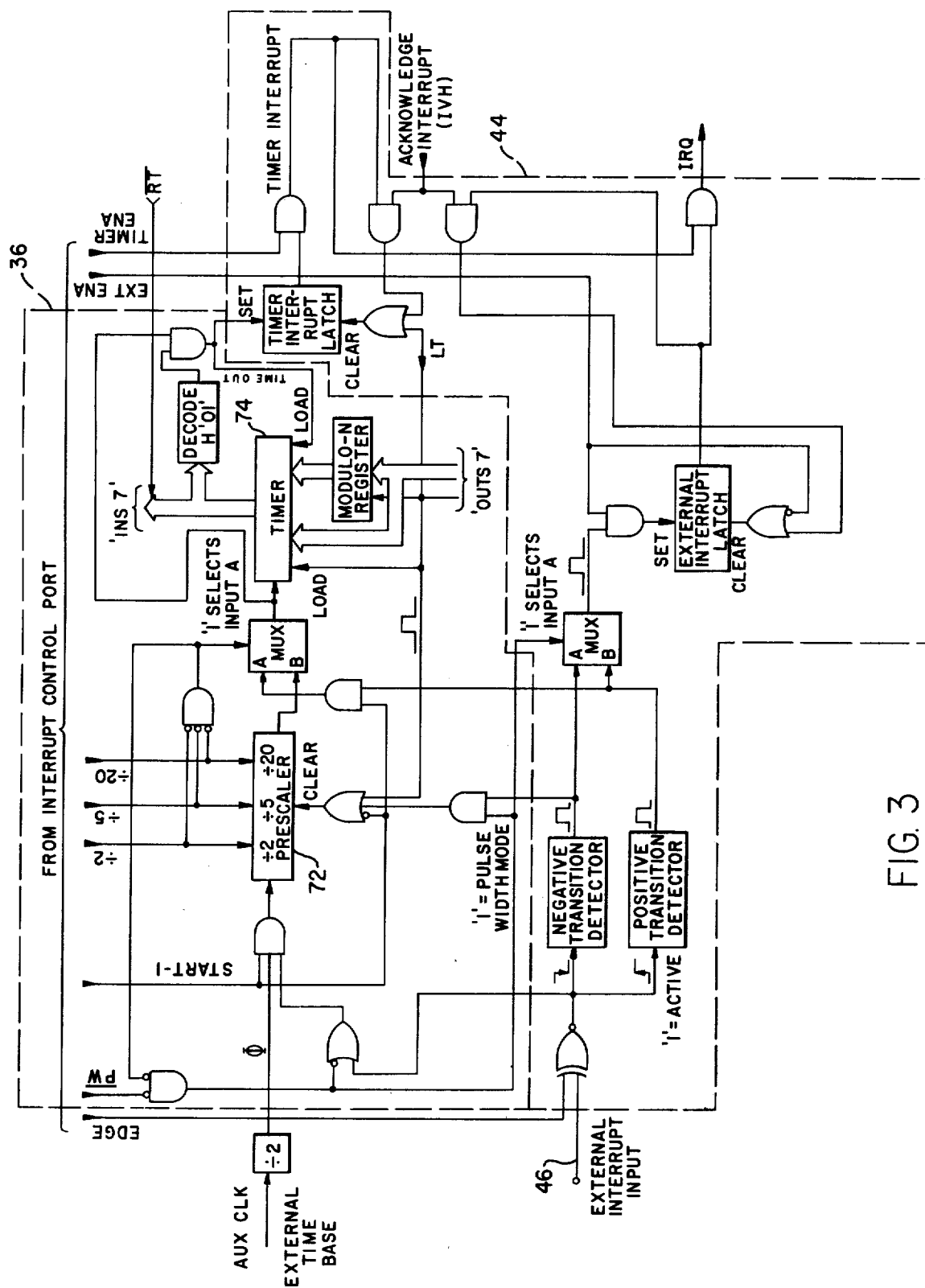
FIG. 3 is a functional diagram of the binary timer and interrupt circuitry of FIG. 1.
Figure 4:
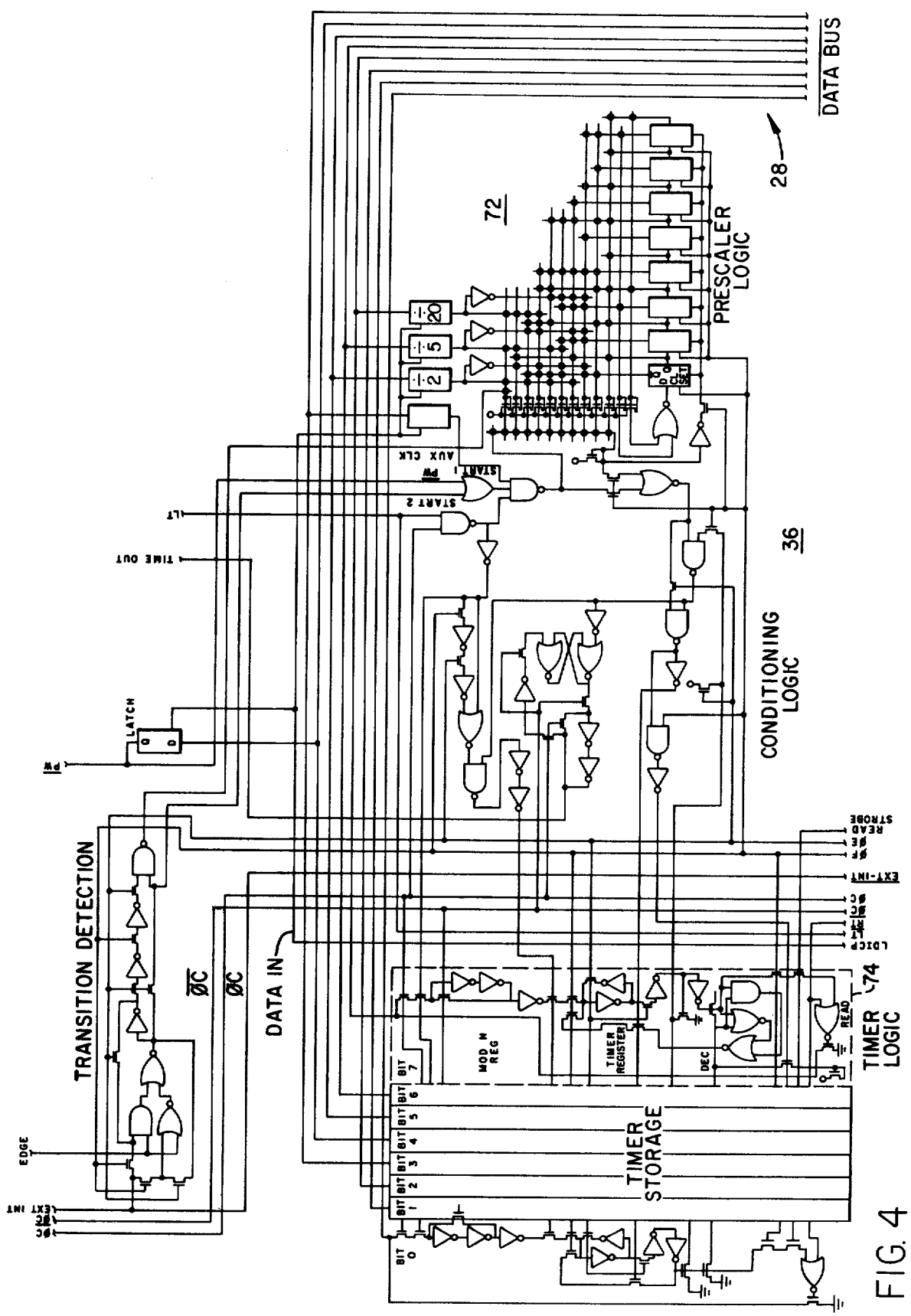
FIG. 4 is a detailed block diagram of the timer shown in FIG. 1.

Referring now to the FIGS. 3 and 4 in addition to FIG. 1, the binary timer 36 is a logic element which permits the main control logic 26 under control by the program stored in the ROM 22 to instruct the binary timer to generate certain program delays or certain time delays and to perform counting functions without interfering with the normal instruction execution or with minimal interference with the execution of instructions. The binary timer 36 performs as a delay timer which is a unit which generates a certain fraction of a second delay under program control, or in another mode it performs as a counter which counts external events. In still another mode, the pulse width measurement mode, the timer may be used to count the number of $\Phi F$ clock cycles that occur between the activation and deactivation of a particular control input thus allowing it to measure the width of a pulse applied to that particular control input.

In the timer delay mode the principal functional units are a prescaler logic unit 72 and a timing logic unit 74. The prescaler 72 is a programmable divider of the $\Phi F$ count clock. The function of the prescaler 72 is to perform a prereduction of the frequency of the input count clock $\Phi F$ so that the longer time delays can be generated with the timer circuitry utilizing the least number of counts in the main timer 36. The control input consists of three signals which select the prescaler division value, a start-stop signal, a control signal PW which indicates that the timer is to function in the pulse width mode, three clock inputs, a read strobe, a write strobe, a count clock, an auxiliary start-stop input called START 2, and an auxiliary count clock. A control output comes from the binary timer to the interrupt logic unit 44 which is called the TIME-OUT signal which indicates that the timer has counted down to a preset value. In addition there are data in and data out channels which are connected to the main data bus 28.

Data input signals are enabled into the binary timer 36 by the LT signal from the port selector logic 20, LOAD TIMER, and data output from the binary timer 36 is enabled out onto the main data bus 28 by the $\overline{\text{RT}}$ signal, READ TIMER.

When the timer is in the MODULO-N timer mode, a selected prescaler divisor is selected by forcing the proper code on the three prescale select inputs (the divide by 20, divide by 5, or divide by 2 input). The timer is not enabled in the PULSE WIDTH mode and the primary start-stop signal would be enabled to allow the timer to run. When enabled to run by the START-1 signal the binary timer 36 will decrement each time the prescaler 72 divides the count clock by the preset number. For example, if the prescaler is enabled to divide by 20, upon the completion of each 20 cycles of the $\Phi F$ count clock, the timer logic 74 will decrement one count. When the main timer register has decremented the prescribed number of counts, the TIME-OUT signal will be produced and the timer will continue to again decrement that number of counts before the next TIME-OUT signal is produced. The number of counts required before the TIME-OUT pulse is produced is set by loading that number into the binary timer 36 by an output instruction to port 7, which in this example is the input of the binary timer 36. For example, if the prescaler 72 is enabled to divide by 20 and the binary timer is loaded with the binary number 10, each 200 cycles of the $\Phi F$ count clock, the TIME-OUT pulse is produced.

Operation of the timer 36 in the pulse width measurement mode is similar to the MODULO-N timer mode except that when the timer is enabled by the pulse width mode signal PW, the auxiliary start-stop signal START 2 must also be activated to enable the timer in the pulse width mode. The auxiliary start signal is activated by a properly buffered and synchronized signal from the external interrupt input, and in the pulse width mode the binary timer 36 will be enabled to run only when the external interrupt pin 46 is in the proper state. Therefore, the width of a pulse on the external interrupt pin 46 can be measured by using the binary timer 36.

In another basic mode of operation, the timer 36 can be set up to count an auxiliary count clock directly without the use of the prescaler. In this mode the no prescale value would be selected, that is the divide-by control inputs would be forced to a logic low level. This is carried out by writing the proper data into the interrupt control port 32 which has been assigned the port number 6. Similarly, the pulse width mode is not selected, therefore the pulse width input would be set to a logic "0". The timer 36 is enabled to start by the main start signal START 1 and when so configured, the timer logic 74 will decrement the main timer once every cycle of the auxiliary clock input. Therefore, the time between time-out pulses may be prescribed to be equal to some number of auxiliary clock pulses. For example, if the binary timer is loaded with the number 10, upon the completion of each ten cycles of the auxiliary input clock, the time-out pulse is produced.

In this arrangement, when the TIME-OUT pulse is produced from the binary timer 36, the pulse goes to the interrupt logic unit 44. If the interrupt logic is properly enabled, an interrupt request will be conveyed to the main control logic 26. Therefore the binary timer can be used to generate certain delays, that is a certain number of counts of the $\Phi F$ count clock, to produce an interrupt request to the main control logic at the end of that delay. Further, the timer may be enabled to count a certain number of auxiliary clock inputs and generate an interrupt request to the main control logic 26 after that number of auxiliary clock cycles have been completed.

The binary timer 36 may also be enabled to run only when the START 2 signal has been activated. The START 2 signal is a derivative of the external interrupt input and will therefore run only when the external interrupt input is in the proper state. This may be employed to measure the width of the external interrupt input pulse. In this mode the information is calculated by reading the contents of the binary timer initially at the start of the pulse and at the end of the pulse calculate the elapsed difference in time rather than by producing an interrupt request to the main control logic, although the interrupt logic unit 46 is still enabled and the interrupt request will be produced if properly configured.

INTERRUPT LOGIC

Figure 5:
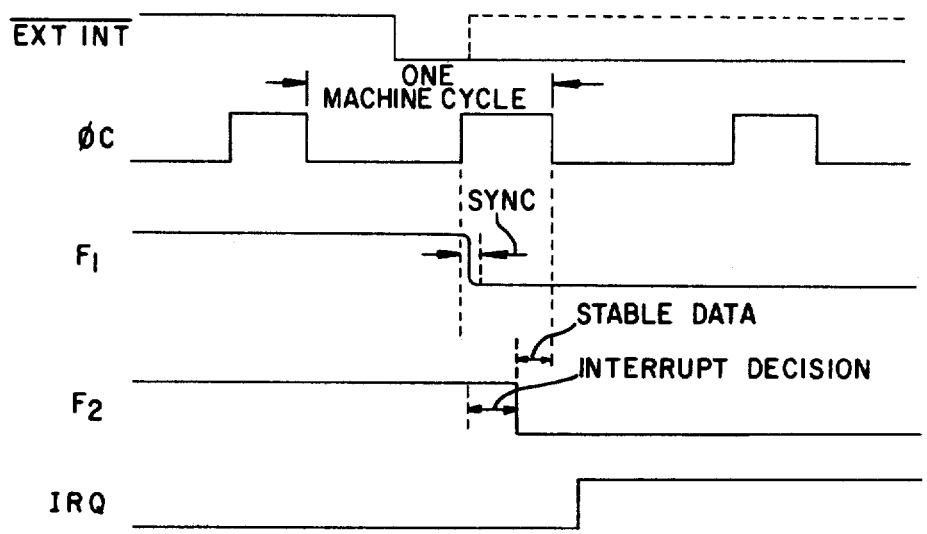
FIG. 5 is a timing diagram which illustrates the decoding execution of an interrupt request.

Referring now to FIGS. 1, 3 and 5, according to a preferred embodiment a derivative of the external interrupt request signal is synchronized with the $\Phi C$ clock to permit interrupt request decoding operations to be performed during the same $\Phi C$ cycle that the interrupt request occurs thereby increasing the maximum bit rate at which serial information may be sampled through the external interrupt input. According to prior art interrupt logic arrangements, a minimum of three $\Phi C$ clock cycles are required for the interrupt request to be decoded and processed and for the interrupt request to be conveyed to the main control logic, which substantially limits the maximum rate at which serial information may be conveyed.

According to the logic arrangement of the interrupt logic unit 44, in response to an external interrupt input, on the following $\Phi C$ cycle the interrupt request is presented to the main control logic 26. It is desirable in certain circumstances that when the external interrupt request is made, that is, when a peripheral device requests that the microprocessor system cease executing the present sequence of instructions and instead execute the new sequence of instructions, it is desirable that this length of time be as short as possible. Therefore, it is desirable that as soon as the external request occurs, that the request be conveyed as quickly as possible to the main control logic, and is also desirable that the main control logic respond to that request as quickly as possible. Because of constraints imposed by the existing conventional instruction sets in regard to the response by the main control logic to the interrupt request, the response time of the main control logic is fixed. However, there is no constraint relating to the manner by which the external interrupt signal is decoded and the length of time required to recognize a valid external interrupt.

The length of time required to decode and convey an external interrupt request to the main control logic is reduced by the circuitry of the present invention in the manner illustrated in FIG. 5. The decoding operation is arranged to occur during the portion of the clock cycle when data on the internal data bus is guaranteed to be stable. This is accomplished by first deriving a signal $F_1$ which is a function of the condition $\overline{\text{EXT INT}}$ being in a logic "0" condition and the $\Phi C$ clock cycle being in a logic "1" condition. However, once $\Phi C$ goes to a logic "1" the $\overline{\text{EXT INT}}$ signal may change without causing $F_2$ to change until the next $\Phi C$ cycle. Therefore $F_1$ is a synchronous logical inversion of the $\overline{\text{EXT INT}}$ signal. A second signal $F_2$ represents the result of the interrupt decision logic which must stabilize before the fall of the $\Phi C$ clock so that the proper request state, either a logic "1" to request an interrupt or a logic "0" if no request is to be made, is transmitted to the control logic immediately after the fall of the $\Phi C$ clock.

SYSTEM OPERATION

With reference to FIGS. 1 and 3, the operation of the binary timer within the present invention will now be described. The operation will be described with respect to configuring the binary timer 36 to function in the MODULO-N delay mode so that it produces a TIME-OUT pulse to the interrupt logic 44 upon the completion of 200 $\Phi F$ clock pulses.

The binary timer 36 is first set for a prescale value of divide by 20 and a main timer 74 set to perform a count of ten. The external interrupt logic 44 is set so that when the time out pulse occurs it is enabled to pass an interrupt request to the main control logic 26. In order to configure the binary timer 36 to operate in this mode, the proper control information must be loaded into the interrupt control port 32. Therefore the divide by 20 input is set and the next two most significant bits are cleared. The timer 36 is enabled to start immediately by setting the start bit. The EDGE pin on the external interrupt pin is set to logic "0". The TIME interrupt is enabled by setting the next bit such that the TIMER ENA signal to the interrupt logic coming from the interrupt control port is enabled. The external interrupt is disabled by setting its least significant bit to logic "0". Therefore the least significant bit is the external enable bit and it is cleared so that external interrupts are not enabled.

The second bit, that is bit 1, is a timer enabled bit. When it is set an interrupt request is enabled to be propagated to the main control logic 26 in response to the TIME-OUT pulse being propagated to the interrupt logic. Bit 3, the third significant bit, is the EDGE bit which selects the active edge of the external interrupt pin. That is, it selects whether a low to high or a high to low transition is to be detected. For purposes of this example, that bit is set to 0. The next bit is the START bit for the binary timer and that is set to logic "1" such that the binary timer is enabled to start. The next bit is the pulse width (PW) which is set to a logic "0" so that the pulse width mode is disabled. The next bit in the register is a divide by two control for the prescaler which is set to 0 and the next two most significant bits are the divide by five which is set to 0 and the divide by 20 prescale input which is set to logic "1". After loading the interrupt control port with that proper data which is represented in hexidecimal notation by 8A, the main timer is then loaded with the decimal value 10 which in hexidecimal notation is 0A. In summary, the main timer is loaded with the count of 10, the prescaler is loaded with the divide by 20, and the timer is enabled to run and the timer interrupt is enabled to occur.

In an example of the execution of a set of instructions in which the timer is configured in the MODULO-N delay mode to produce interrupts to the main control logic every 200 $\Phi F$ clocks, the first thing which occurs is that the first instruction in the sequence must be fetched, which in this example is machine code 20 located at address 100. The program counter in the address register array 48 must be selected so that the program counter content 100 is enabled onto the ROM address bus 68. That information is then latched into the address latch 64 and is thereafter conveyed to the program ROM 22. After the program ROM 22 has been addressed the machine code 20 will appear on its output which corresponds with that address.

In order to get that data into the instruction register 42, the ROM-DATA BUS control line must be activated. With the FETCH signal activated, that information will be transferred from the data bus into the instruction register 42 synchronously with the $\Phi C$ clock. Additionally, during this fetch the increment signal INC to the adder/incrementor 66 will be activated so that the information appearing on the ROM address bus will be incremented and at the end of the cycle the new incremented value 101 will be driven back out onto the ROM address bus 68. The program counter will still be selected by the main control logic and the READ/WRITE line will be transferred from the READ state to the WRITE state so that the incremented information 101 is loaded back into the program counter. The operational code has now been fetched into the instruction register 42 and the contents of the program counter have been incremented from 100 to 101.

At the start of the next machine cycle as defined by the $\Phi C$ clock, the machine code 20 which is in the instruction register 42 will be decoded in the main control logic 26. This instruction is in this example LOAD IMMEDIATE, so the next bit of information or word of information stored in the program ROM is to be loaded into the accumulator 30. Therefore since the instruction operation code is in the ROM at the location 100 the data word at location 101 is to be loaded into the accumulator. In this example the data words contents are hexadecimal 8A. The main control logic must transfer this word in the program ROM into the accumulator 30.

In order to carry out that operation, the main control logic 26 again selects the PC register in the address register file 48 which enables it onto the ROM address bus 68. Therefore the contents of the ROM address bus will then be the incremented data 101. The information which is stored at location 101 will be transferred through the data output bus 70 of the ROM and will be presented at the transfer gate to the main data bus 28. Additionally, the main control logic will activate the DATA BUS-S transfer signal so that the information 8A will be transferred from the data bus to the S-bus input of the ALU 24.

Additionally, the main control logic 26 will deactivate all controlling inputs to the A-bus of the ALU 24 so that neither the accumulator 30 nor the status register 56 will be selected. No data will be shifted or complemented so that the A-bus input to the ALU 24 will be all 0's. The ADD signal to the ALU will be activated so that the contents of the S-bus (8A) will be added to the A-bus (0) which will allow the S-bus to pass its data unaltered through the ALU.

With the load accumulator signal LD ACC activated and synchronized with the $\Phi C$ clock, data will be latched into the accumulator 30. Therefore, according to the foregoing description, data will have been transferred from the incremented ROM location 101 into the accumulator 30. Additionally, once the program counter data has been latched into the address latch 64, the adder/incrementor 66 will drive the incremented value 102 back out onto the ROM address bus. With the program counter selected, the READ/WRITE line to the address register array 48 will change to the WRITE state so that at the end of the cycle the accumulator 30 will have been loaded with the information corresponding to the incremented location 102 which is stored in the program counter of the ROM address register array 48.

The final cycle of the LOAD IMMEDIATE instruction is the FETCH of the next instruction which is to occur. This is carried out by activatng the FETCH signal from the main control logic 26 and selecting the program counter from the address register file 48 so that the ROM address bus is loaded with the incremented address location 102. This will be latched into the address latch 64 so that the information at ROM location 102 will appear on the data output of the ROM 22. The ROM-DATA BUS signal will be activated so that the information passes from the output of the ROM onto the main data bus 28, and because the FETCH signal has been activated, that information will be latched into the instruction register 42 synchronously with the $\Phi C$ clock. Additionally, the adder/incrementer 66 will be enabled to increment and once the 102 address has been latched into the address latch 64, the incremented value 103 will be driven back out onto the ROM address bus 68 and the READ/WRITE line into the address register array 48 will be switched from the READ mode to the WRITE mode such that the incremented value 103 will be written back into the program counter of the address register array 48.

The new instruction command B6 which was the data fetched from address 102 will now be latched into the instruction register 42. At the start of the next cycle the main control logic will decode the B6 command which is the command to ouput data to port 6 (interrupt control port). In order for the port select logic 22 to activate port 6, the address of that port must be driven onto the data bus 28. The address of port 6 is contained in the lower four bits of the OUTPUT SHORT command B6. Therefore, in order to transfer port address 6 onto the data bus 28, the lower four bits of the instruction register must be driven onto the main data bus. To accomplish this, the IR-S signal is activated. This enables the lower four bits of the instruction register to be transferred to the S-bus input of the ALU. Since there are no signals activated which control the A-bus to the ALU, the A-bus contents will be 00. The ALU will be enabled to add therefore the 06 will be added to 00 which means it passes through the ALU unaltered and the value 06 will appear on the result bus 54. The RESULT BUS-DATA BUS signal will be activated so that the contents of the result bus 54 will be transferred to the main data bus. Therefore, the value 06 having originated in the lower bits of the instruction register 42 will have been forced onto the main data bus 28.

During the next cycle the main control logic 26 will enable the contents of the accumulator 30 onto the main data bus 28 and instruct the port select logic 20 to load that data into the port whose address was on the bus during the previous cycle. To accomplish this the ACC-ALU control signal from the main control logic 26 is activated. This permits the contents of the accumulator 30 to be transferred into the selector shifter 50. No shifts will be performed on the data so that the data will pass through the shifter unaltered. Also, the data will pass through the complementor 52 unaltered because the complement signal COMP is not activated. No driving element is enabled onto the S-bus therefore the S-bus input to the ALU is all 0's and the ALU will be enabled to add. Thus the contents of the accumulator will pass through the ALU to the result bus 54 unaltered. The information in the accumulator is 8A, having previously been set from the LOAD IMMEDIATE instruction which was previously executed. Therefore the contents loaded on the main data bus 28 is 8A.

Additionally, the main control logic 26 will activate the load high (LD HI) input to the port select logic 20. This instructs the port select logic to load the information from the main data bus into the high number port whose address was on the data bus during the previous cycle, which was 06. As a result of the value 06 having been on the data bus in the previous cycle and as a result of the LD HI signal being activated during the current cycle, the port select logic 20 will activate the LICP signal which causes the contents of the main data to be transferred into the interrupt control port 32 synchronized with the ΦC clock.

Therefore, at the end of this cycle the instruction register will still contain the instruction B6. The program counter in the address register array 48 will contain 103 and the accumulator 30 will still contain 8A, but the interrupt control port 32 will also now contain the data 8A and that information will be transferred to the outputs of the interrupt control port, which go to the control inputs of the binary timer 36 and the interrupt logic 44. This information will then have configured the binary timer to function with the prescale at the divide by 20 in the MODULO-N delay mode. It will also have started the timer and will have enabled the timer interrupts.

The count of ten remains to be loaded into the main timer so that when combined with the prescale value of divide by 20, the binary timer produces the TIME-OUT signal after the occurrence of 200 ΦF clock pulses. To accomplish this, the next instruction is fetched. The program counter is selected from the ROM address register array 48 onto the ROM address bus. The address of the contents of the bus is latched into the address latch 64 which is the current contents of the program counter 103. Therefore 103 will be the address to the program ROM, and the information at location 103 will appear on the ROM data output bus 70. In this example the information is 7A. Additionally, the adder/incrementor will be enabled to increment. Once the ΦE clock pulse has ended, indicating that the information is now latched into the address latch, the adder incrementor will drive back onto the ROM address bus 68. The increment value is 104.

At this point in the execution of the program the READ/WRITE line in the address register file 48 will be switched from the READ to the WRITE mode thereby enabling the 104 information to be written back into the selected program counter. Additionally, the ROM-DATA BUS signal will be activated so that the data appearing on the output of the ROM is transferred to the main data bus and the fetch signal will be activated so that the information is loaded into the instruction register 42 synchronously with the ΦC clock. Therefore at the end of the cycle the program counter contains the location 104. The instruction register 42 will contain the command 7A.

At the start of the next cycle the main control logic will decode the instruction 7A recognizing that this corresponds to the LOAD IMMEDIATE SHORT instruction. In the LOAD IMMEDIATE SHORT instruction the main control logic 26 is commanded by the instruction to place the lower four bits of the instruction into the accumulator 30. To accomplish this, the main control logic will enable the IR-S line so that the lower four bits of the instruction register that is hexadecimal A, will be transferred to the S-bus so that the contents of the S-bus will be 0A. No element will be selected onto the A-bus of the ALU so that the A-bus will be 00. The ADD command is given to the ALU by the main control logic 26 therefore adding 00 to A and the result 0A will appear on the result bus 54. The load accumulator signal LD ACC will be activated so that the contents of the result bus, 0A, will be loaded synchronously with the ΦC clock into the accumulator 30. At the end of this cycle the instruction register 42 will still contain the data 7A, but the accumulator 30 will now have 0A loaded into it.

The program counter remains loaded with the code 104. During the next cycle the main control logic 26 will fetch the next instruction from the ROM 22. To accomplish this the program counter is selected from the address register file 48 onto the ROM address bus 68, the READ/WRITE control is placed in the READ mode, and information is latched into the ROM address latch synchronously with the ΦE clock. Therefore, the ROM 22 will be addressed at location 104. The date appearing at location 104 will be driven onto the data output bus 70 of the ROM. Additionally, the adder/incrementor 66 will be enabled to perform an increment and at the proper time the incremented value 105 will be driven back out onto the ROM address bus 68. The READ/WRITE signal to the address register array will be switched to the WRITE mode so that the incremented value 105 is written back into the program counter. Thus at the end of this cycle, the program counter will contain the information 105.

The data in ROM location 104 in this example is B7. That is the instruction for OUTPUT SHORT-PORT 7. The ROM-DATA BUS signal will be activated so that the data is transferred from the ROM output bus onto the main data bus. The FETCH signal will be activated so that the information on the data bus is transferred into the instruction register 42. Therefore at the end of the cycle the program counter will contain the code 105 and the instruction register will contain instruction B7.

At the start of the next cycle, the main control logic decodes the new instruction B7 and realizes that this is a command to output the data from the accumulator to port 7.

In order to address port 7 the main control logic 26 must first place the port address on the data bus 28. The signal IR-S will be activated which transfers the lower four bits of the instruction register onto the S-bus. The ADD signal will be enabled, therefore results of the ALU will simply be the S-bus unaltered which is the data 07 which originated from the lower four bits of the instruction register 42. The result bus will be enabled onto the data bus by means of the RESULT-DATA BUS CONTROL signal. Therefore, the contents of the data bus 28 will be 07.

During the next cycle the main control logic 26 will enable the contents of the accumulator 30 to be driven onto the main data bus. The port select logic 20 will be selected to load that data into the port whose address was on the bus during the previous cycle. To accomplish this, the ACC-ALU signal is activated thereby permitting the data stored in the accumulator 30 to be transferred into the shifter 50. The shifter 50 and complementor 52 are not enabled therefore the data passes from the accumulator into the ALU unaltered. Since no element is enabled to drive the S-bus, the S-bus input to the ALU is all o's. The ADD command is given to the ALU and the result appears on the result bus 54. The RESULT-DATA BUS signal is activated thereby enabling the transfer of the result bus data onto the data bus. Additionally, the main control logic 26 activates the load high input to the port select logic 20 thereby instructing the port select logic to load the contents of the data bus into the high number port whose number appeared on the data bus during the previous cycle, timer port 7.

After properly decoding the fact that the data bus contained the number 07 in the previous cycle, the port select logic 20 is instructed to perform a load high command. In response to this command the port select logic 20 activates the load timer signal thereby enabling the data on the main data bus 28 to be transferred into the main timer register of the binary timer 36. At the end of this cycle the instruction register 42 will still contain the machine instruction B7, and the location 105 will be stored in the program counter of the address register 48. The accumulator 30 content is 0A and the information 0A has been transferred into the main data bus and loaded into the binary timer 36. Therefore, the binary timer will contain the data hexadecimal 0A, which is equivalent to a decimal value of ten. Having previously been set up to perform a divided by 20 of the ΦF clock, and having previously been enabled to start, the timer 36 will now commence operation.

The binary timer 36 was previously running prior to the load of the data 0A. However, at the time the load timer command is given to the binary timer it will clear any residual count in the prescaler 72 so that at the end of the cycle the timer will restart its count. First it will divide the ΦF clock by 20. Once that is accomplished it will decrement the main timer register by one. Therefore it will decrement from 0A to 09. This will continue until 200 ΦF clocks have elapsed. When this occurs, the TIME-OUT pulse will be conducted to the interrupt logic 44 and the interrupt request will subsequently be transferred to the main control logic 26.

The output to port 7 instruction B7 is not completed until the fetch of the next instruction has been executed. Each instruction is responsible for fetching the next instruction so that the main control logic will automatically step through the instruction sequence. Therefore the fetch of the next instruction, whatever it may be, will be performed in the manner previously described, and that instruction will be located at program location 105 which is the current contents of the program counter.

From the foregoing description, it is seen that the microprogrammed computer of the present invention provides for very efficient instruction processing while substantially reducing the storage requirements of such apparatus.

While in accordance with the statutes there has been illustrated and described the best form of the invention known, certain changes may be made to the system described without departing from the spirit and scope of the invention as defined in the appended claims. It will be recognized that in some cases, certain features of the invention may be used to advantage without a corresponding use of other features.

What is claimed is:

1. A counter circuit for producing a time-out signal comprising:
   a time register for storing a particular count number;
   a decrementor coupled to the count number output of the time register and which produces an output equal to the counter number minus one;
   a decoder coupled to the count number output of the time register and which produces a first voltage level when the count number output of the time register is equal to one;
   external means for producing a main count pulse;
   external means for producing a load signal;
   a time register load control unit which receives the output signal from the decoder, the main count pulse and the load signal and which produces a count signal when the main count pulse occurs, the decoder output is not at the first voltage level and the load signal is not occurring, and which produces a reload signal when the main count pulse occurs and the decoder output is at the first voltage level, or when the load signal occurs;
   first gating means for transferring the output of the decrementor into the time register when the count signal is produced by the time register load control unit;
   a modulo-N data storage means for storing an initial count number N for the time register, N being a positive integer;
   second gating means for transferring the initial count number N from the modulo-N data storage means to the time register when the reload signal is produced by the time register load control unit; and
   a third gating means for producing at time out signal when the decoder output is at a first voltage level, the main count pulse occurs and the load signal is not occurring.

2. The counter circuit of claim 1 further comprising:
   external means for supplying an initial count number N; and
   a fourth gating means for transferring the initial count number N to the modulo-N data storage means when the load signal occurs.

3. The counter circuit of claim 1 further comprising:
   external means for producing a read signal; and
   means for reading the count number output of the time register when the read signal occurs.

4. The counter circuit of claim 1 wherein the external means for producing a main count pulse comprises:
   external means for producing a clock signal;
   external means for producing an auxiliary control signal;
   a control register for storing and producing a plurality of signals including a stop signal, a pulse width signal, and at least one prescale control signal;
   a control unit which receives the clock signal, the auxiliary control signal and the control register output signals, and which produces
   even count mode count pulses when the stop signal and the prescale control signals are not occurring, each time the auxiliary control signal transitions from a first voltage level to a second voltage level,
   prescale mode count pulses when the stop signal and pulse width signal are not occurring and at least one prescale control signal is occurring, each time a number of clock signals occur, the number being determined by the prescale control signal, and
   pulse width mode count pulses when the stop signal is not occurring, the pulse width signal and at least one prescale control signal are occurring and the auxiliary control signal is at the first voltage level, each time a number of clock signals occur, the number being determined by the prescale control signal.

5. A method for producing a time-out signal comprising:
   generating a first load signal;
   a second load signal, a control signal, a clock signal and a read signal;
   receiving a first set of data when the first load signal occurs;
   receiving a second set of data when the second load signal occurs;
   decoding the first set of data to select one of three possible modes of operation;
   decoding the first set of data to select a prescale value when a first or second mode of operation has been selected;
   decoding the second set of data to select a second pulse value;
   producing a first pulse when the first mode of operation has been selected each time the clock signal occurs a number of times determined by the prescale value multiplied by the second pulse value;
   producing a first value when the first mode of operation has been selected and the read signal occurs, said first value being determined by the number of times the clock signal occurs between the occurrences of the first pulse divided by the prescale value;
   producing a second pulse when the second mode of operation has been selected and the control signal occurs each time the clock signal occurs a number of times determined by multiplying the prescale value by the second pulse value;
   producing a second value when the second mode of operation has been selected and the read signal occurs, said second value being determined by the number of times the clock signal occurs between the occurrences of the first pulse divided by the prescale value;
   producing a third pulse when the third mode of operation has been selected each time the control signal occurs a number of times determined by the second pulse value; and
   producing a third value when the third mode of operation has been selected, said third value being determined by the number of times the control signal occurs between occurrences of the first pulse.

6. A count pulse generator circuit comprising:
   external means for producing a clock signal;
   external means for producing an auxiliary control signal;
   a control register for storing and producing a plurality of signals including a stop signal, a pulse width signal, and at least one prescale control signal;
   a control unit which receives the clock signal, the auxiliary control signal and the control register plurality of signals, and which produces
   event count mode count pulses when the stop signal and the prescale control signals are not occurring, each time the auxiliary control signal transitions from a first voltage level to a second voltage level,
   prescale mode count pulses when the stop signal and pulse width signal are not occurring and at least one prescale control signal is occurring, each time a number of clock signals occur, the number being determined by the prescale control signal, and
   pulse width mode count pulses when the stop signal is not occurring, the pulse width signal and at least one prescale control signal are occurring and the auxiliary control signal is at the first voltage level, each time a number of clock signals occur, the number being determined by the prescale control signal.

7. The count pulse generator circuit of claim 6 further comprising:
   means for producing a load control register signal;
   means for producing a plurality of signals including a stop signal, a pulse width signal and at least one prescale control signal; and
   gating means for transferring the plurality of signals to the control register when the load control register signal occurs.

8. The count pulse generator circuit of claim 6 wherein the count pulse output of the control unit is inhibited when the stop signal is occurring.

9. A count pulse generator circuit operational in a plurality of modes to produce a multiple-purpose pulse output signal in response to at least one prescale signal and a plurality of control signals, including a clock signal, an auxiliary clock signal, first and second start signals and a pulse width signal comprising:
   (a) control circuitry for receiving said control signals and generating a plurality of mode signals representative of one of said plurality of modes;
   (b) prescaler logic circuitry responsive to said mode signals and said at least one prescale signal to generate a timing pulse representative of a predetermined multiple of pulses of said pulse output signal; and
   (c) a timing logic unit responsive to said timing pulse to generate one pulse of said multiple-purpose pulse output signal upon counting said predetermined multiple of said timing pulses, said multiple-purpose pulse output signal being representative of:
      (1) time count pulses with the count pulse generator circuit operating in a time count mode, wherein the first start signal is occurring, the pulse width signal is not occurring, and at least one prescale signal is occurring, one of said time count pulses being produced each time a number of clock signals occur, the number being determined by said at least one prescale signal;
(2) pulse width pulses with the count pulse generator circuit operating in a pulse width mode, wherein the first and second start signals the pulse width signal and at least one prescale signal are occuring, one of said pulse width pulses being produced to measure the width of the second start signal each time a number of clock signals occur, the number being determined by said at least one prescale signal; and
(3) event count pulses with the count pulse generator circuit operating in an event count mode, wherein the first start signal is occurring, and the pulse width signal and all of the prescale signals are not occurring, said event count pulses being produced each time the auxiliary clock signal transitions from a first voltage level to a second voltage level.

10. The pulse generator circuit of claim 9 wherein said timing logic unit includes a data storage unit for receiving and storing a modulo-N signal representative of a positive integer N, and count logic means connected to said data storage unit for generating a counting signal representative of said predetermined multiple in response to said modulo-N signal.

* * * * *